United States Patent
Nakaoka

[11] Patent Number: 6,038,648
[45] Date of Patent: Mar. 14, 2000

[54] SEMICONDUCTOR MEMORY DEVICE HAVING THE SAME ACCESS TIMING OVER CLOCK CYCLES

[75] Inventor: Yuji Nakaoka, Tokyo, Japan

[73] Assignee: NEC Corporation, Tokyo, Japan

[21] Appl. No.: 08/707,386

[22] Filed: Sep. 4, 1996

[30] Foreign Application Priority Data

Sep. 19, 1995 [JP] Japan .................................. 7-264948

[51] Int. Cl.$^7$ .............................................. G11C 11/401
[52] U.S. Cl. ........................... 711/200; 711/104; 711/219
[58] Field of Search .................................. 711/200, 213, 711/219, 104

[56] References Cited

U.S. PATENT DOCUMENTS

| | | | |
|---|---|---|---|
| 4,621,320 | 11/1986 | Holste et al. | 711/213 |
| 5,347,232 | 9/1994 | Nishimichi | 331/1 A |
| 5,426,606 | 6/1995 | Takai | 365/189.05 |
| 5,550,784 | 8/1996 | Takai | 365/233 |
| 5,608,686 | 3/1997 | Takai | 711/167 |
| 5,610,874 | 3/1997 | Park et al. | 365/236 |
| 5,634,030 | 5/1997 | Nakano | 711/213 |

FOREIGN PATENT DOCUMENTS

| | | |
|---|---|---|
| 6-290582 | 10/1994 | Japan . |
| 6-302185 | 10/1994 | Japan . |
| 6-318391 | 11/1994 | Japan . |
| 7-169265 | 7/1995 | Japan . |

Primary Examiner—Eddie P. Chan
Assistant Examiner—Yamir Encarnacion
Attorney, Agent, or Firm—Foley & Lardner

[57] ABSTRACT

In order to generate internal addresses from an external address in a burst operation in a synchronous dynamic random access memory (SDRAM), an external address is latched in response to an external clock signal. First and second control signals are generated in synchronous with the external clock signal. An internal address for a first clock cycle of a burst operation is generated from the latched external address in a sequential mode in response to the first control signal using a first transfer path. An internal address for each of a second clock cycle and subsequent clock cycles of the burst operation in the sequential mode is generated in response to a second control signal using a second transfer path such that the internal address for each of the second clock cycle and subsequent clock cycles has substantially the same delay time as that of the internal address for the first clock cycle with respect to the external clock signal. The first control signal is generated based on a command signal for designating a read or write operation, in response to an internal clock signal synchronous with the external clock signal and the second control signal is generated in the burst operation in response to the internal clock signal.

6 Claims, 9 Drawing Sheets

SEMICONDUCTOR MEMORY DEVICE HAVING THE SAME ACCESS TIMING OVER CLOCK CYCLES

BACKGROUND OF THE INVENTION

1. Field of the Invention

The present invention relates to a semiconductor memory device, and more particularly to a semiconductor memory device which operates in synchronous with an external clock signal.

2. Description of Related Art

Recently, in order to cope with the speeding-up of a CPU, a dynamic random access memory (DRAM) which operates in synchronous with an external system clock signal, i.e., a synchronous DRAM (called "SDRAM") has been developed and manufactured. In the SDRAM, an address and a command which are supplied to pins of the semiconductor memory device are latched at the rising edge of the external clock signal (CLK). Moreover, the internal operation is executed in synchronous with the external clock signal (CLK).

Briefly describing the operation of the SDRAM in comparison with a general-purpose asynchronous DRAM, the case that an active command is given to the SDRAM at a rising edge of the external clock signal is equivalent to the case that a row address strobe (RAS−) ("−" shows an inverted signal and means that the signal is low active) is changed from an "H" level (high level) to a low level (low level) in the general-purpose asynchronous DRAM. That is, in response to an active command, one of word lines corresponding to a row address applied to the address input pins is selected. On the contrary, the case that a precharge command is given at the rising edge of the external clock signal is equivalent to the case that the row address strobe RAS− signal is changed from the "L" level to the "H" level in the general-purpose asynchronous DRAM. As a result, a data value is restored in a memory cell, the selected word line is set to a non-selected state, and nodes in respective portions are precharged.

Also, in the SDRAM, programming can be externally made so that the SDRAM can operate under the optimal condition with the system clock signal having a predetermined frequency. This can be achieved by giving an address key to the address simultaneously with a mode register set command. As one of the operation modes of the SDRAM, a column address strobe (CAS) latency is important. The CAS latency is defined as the number of clock cycles from the time when a read command is issued to the time when the first data is outputted and latched. Also, the continuous read or write operation is called a "burst". The burst length can be also set in the mode setting.

In a case of the burst mode in the SDRAM, addresses do not have to be continuously inputted from outside. Internal addresses (column addresses) are automatically generated by an internal counter using the first column address as a start address. There are two kinds of address generating methods. One is a "sequential type" of address generation and the other is an "interleave type" of address generation.

In the sequential type of address generation, the generated address data is incremented one by one in the lower bits of the generated address corresponding to the burst length. That is, assuming that the two lower bits of the start address are "0", "1", "2" and "3", in a case where the burst length is "4" for example, the internal addresses are changed so as to be "0"→"1"→"2"→"3", "1"→"2"→"3"→"0", "2"→"3"→"0"→"1" and "3"→"0"→"1"→"2", respectively. Here, the "change of the lower two bits" means that upper bits are not changed. That is, if the start address is 1A2 (Hex; hexadecimal notation), the internal address is changed to be 1A2(Hex)→1A3(Hex)→1A0(Hex)→1A1(Hex).

On the other hand, in the "interleave type" of address generation, assuming that the two lower bits of the start address are "0", "1", "2" and "3", in a case where the burst length is "4" and a predetermined data is "1", for example, the internal addresses are changed so as to be "0"→"1"→"2"→"3", "1"→"2"→"3"→"0", "2"→"3"→"0"→"1" and "3"→"0"→"1"→"2", respectively.

When the read or write operation is executed for the burst length, the read or write operation is thereafter performed in the inside of the SDRAM.

FIGS. 1 and 2 are diagrams which show the structure of internal column address generating circuits of a column address buffer circuit in the conventional SDRAM having the burst function. FIG. 3 is a diagram which shows the structure of a generating circuit of a control signal YAL in the above conventional SDRAM. See Japanese Laid Open Patent Disclosure (Heisei 6-290582) as such a conventional example of SDRAM, for example. In the above reference, the changing operation of the internal address in the burst mode is performed only by the column address buffer circuit. Also, a counter of the address generating circuit is used commonly in both of the sequential mode and the interleave mode. Further, the counter is also used as a counter of a burst end detecting circuit. As a result, the high-speed operation in the burst mode of the conventional SDRAM is achieved.

Next, the conventional SDRAM will be described with reference to FIGS. 1 to 3. In FIGS. 1 to 3, reference symbols INV149 to INV194 denote inverters, NOR102 to NOR105 denote NOR gate circuits, NA109 to NA113 denote NAND gate circuits, and XOR104 to XOR106 denote exclusive logic summation (exclusive OR) gate circuits. Reference symbols TG115 to TG130 denote CMOS-type transfer gates each being composed of an N-channel MOS transistor and a P-channel MOS transistor (which is surrounded by a circle), and N153 to N207 denote nodes. Also, a signal MDBT specifies the sequential mode of the internal address when being in the "L" level and the interleave mode of the internal address when being in the "H" level. A signal RWCMD is a command signal which specifies the read operation or the write operation. A signal YAL is a signal which is used to latch an external address in the first cycle of the burst operation. IA0, IA1 are signals which shows the bit 0, i.e., LSB and bit 1 of the latched external address signal, respectively. A signal ICLK is an internal clock signal which is generated in response to the external clock signal CLK. The internal clock signal ICLK is generated as a 1-shot pulse in synchronous with the rising edge of the external clock signal. A signal PEN is an internal operation permission signal (a burst operation permission signal). Signals Y0T/Y0N and Y1T/Y1N (the signals Y0N and Y1N are inverted signals of the signals Y0T and Y1T) show two lower bits of the internal address signal from the LSB. Signals BCIN0 and BCIN1 indicate counter increment signals.

FIG. 1 shows the internal column address generating circuit of the column address buffer circuit for the LSB Y0 of the internal address signal and FIG. 2 shows the internal column address generating circuit for the second lower bit Y1 of the internal address signal for the LSB. The counter increment signal BCIN0 of FIG. 1 is inputted to the column address generating circuit of FIG. 2.

The column address generating circuit for the LSB Y0 of the internal address signal will be described with reference to FIG. 1. The external address signal IA0 is connected to terminals of the internal address signals Y0T and Y0N through the transfer gate TG115 which is controlled by the signal YAL and through the transfer gate TG116 which is controlled by the read/write command signal RWCMD, via the inverter INV154 and INV155 and the inverter INV154, INV158 and INV159, respectively. The output (the node N163) of the transfer gate TG115 is supplied to the first flip-flop composed of the inverters INV156 and INV157. The output (the node N163) of the transfer gate TG115 is also supplied to the second flip-flop composed of the inverters INV162 and INV163 through the NAND gate circuit NA109, the transfer gate TG117 controlled by the signal RWCMD, and the transfer gate TG118 controlled by the internal clock signal ICLK and the permission signal PEN. The output of the inverter INV162 constituting the second flip-flop is supplied through the transmission gate TG119 to one (the node N174) of the input terminals of exclusive OR gate circuit XOR104. The output (node N167) of the inverter INV156 constituting the first flip-flop is supplied to the other input terminal of the exclusive OR gate circuit XOR104. The output of the exclusive OR gate circuit XOR104 is connected to the internal address signal terminals Y0T/Y0N via the inverters INV154, INV155, INV158 AND INV159 through the transfer gate TG120 controlled by the signals RWCMD and MDBT. The output (the node N174) of the transfer gate TG119 is also supplied to the third flip-flop composed of the inverters INV164 and INV165. The output of the inverter INV164 is connected to the internal address signal terminals Y0T/Y0N via the inverters INV154, INV155, INV158 and INV159 to and so on through the transfer gate TG121 controlled by the signals MDBT and RWCMD. The output (the node N171) of the transfer gate TG117 is connected to the terminal of the signal BCIN0 via the inverter INV169. The output of the inverter INV165 constituting the third flip-flop is connected to the node N171 through the transfer gate TG122 controlled by the signal RWCMD.

Referring to FIG. 2, the structure of the column address generating circuit for the second lower bit Y1 of the address signal from the LSB will be described. In FIG. 2, the output of the transfer gate TG125 which corresponds to the transfer gate TG117 of FIG. 1 is not inputted to not the transfer gate TG126 which corresponds to the transfer gate TG118 of FIG. 1, but rather is inputted to one of the input terminals of the exclusive OR gate XOR105. The counter increment signal BCIN0 from the column address buffer circuit for the LSB Y0T of the internal address signal is supplied to the other input terminal of the exclusive OR gate XOR105. The output of the exclusive OR gate XOR105 is supplied to the transfer gate TG126 (corresponding to the transfer gate TG118 of FIG. 1) via the inverter INV181. The other sections of the structure of the column address buffer for the next lower bit Y1 of the address signal are the same as those for the LSB Y0 of the address signal shown in FIG. 1. Also, the counter increment signal BCIN1 is supplied to a column address buffer circuit (not illustrated) for the third lower bit Y2 of the address signal when the burst length is "8", for example.

Referring to FIG. 3, the address latch control signal YAL is generated based on the logic product of the signal by delaying the internal clock signal ICLK by the inverters INV192 and INV193 and the read/write command signal RWCMD.

Next, the operation of the conventional internal address generating circuit will be described with reference to the timing charts of FIGS. 4A to 4M. For simple description, assume that the CAS latency (CLT) is "3" and the burst length (BL) is "4".

First, the operation of the conventional internal address generating circuit in the sequential mode will be described. In this case, the signal MDBT which controls the mode is present to the "L" level.

When a read or write command ("the read command" in FIG. 4A) is first latched, the signal RWCMD is set to the "H" level during a time period of the external clock, as shown in FIG. 4D. At that time, the 1-shot pulse of the internal clock signal ICLK is generated in synchronous with the external clock signal CLK, as shown in FIG. 4C, and the signal YAL is generated as a 1-shot pulse using the circuit shown in FIG. 3, as shown in FIG. 4F. Since the transfer gates TG115 and TG123 are turned on while the signal YAL is in the "H" level, the latched external address signals are taken in the SDRAM and the address signal bits IA0 and IA1 are latched by the first flip-flop composed of the inverter INV156 and INV157 and the first flip-flop composed of the inverters INV175 and INV176, respectively. At this time, the read/write command signal RWCMD is in the "H" level so that the transfer gates TG116 and TG124 are in the ON condition. As a result, the latched external address bit signals IA0 and IA1 are output to the internal address signal terminals Y0T/Y0N and Y1T/Y1N just as they are (The start address is "0"), as shown in FIGS. 4H and 4I.

On the other hand, when the signal RWCMD is in the "H" level as shown in FIG. 4D, since the transfer gates TG117 and TG125 are in the ON state, the information of the start address, i.e., the latched address bit signals, are transferred to the nodes N171 and N195. In this case, because the external address bit signals IA0 and IA1 are both in the "L" level as shown in FIG. 4B, the potentials of the nodes N171 and N195 as the outputs of the transfer gates TG117 and TG125 for transferring the output of the NAND gates NA109 and NA111 are set to the "H" level, respectively. As a result, the counter increment signals BCIN0 and BCIN1 are set to the "L" level as shown in FIGS. 4J and 4K.

When in response to the next pulse of the external clock signal, the read/write RWCMD control signal is changed from the "H" level to the "L" level as shown in FIG. 4D, the transfer gate TG116 is turned off in the column address generating circuit shown in FIG. 1, because the signal MDBT is fixed on the "L" level. On the contrary, the transfer gate TG121 is turned on. In the column address generating circuit shown in FIG. 2, the transfer gate TG124 is turned off and the transfer gate TG129 is turned on. Also, the transfer gates TG120 and TG128 are held in the OFF state in this case. However, the transfer gates TG119 and TG127 are set to the ON state in response to the 1-shot pulse of the internal clock ICLK before the transfer gates TG121 and TG129 are set to the ON state. As a result, an address bit signal obtained by adding "1" to the LSB of the latched start external address signal is transferred to the nodes N175 and N202 which are the outputs of the inverters INV164 and INV187 constituting the third flip-flops, respectively. That is, in this case, the voltage of the node N175 of FIG. 1 changes from the "L" level to the "H" level. In FIG. 2, since the inputted counter increment signal BCIN0 is in the "L" level and the voltage of the node N195 which is the output terminal of the transfer gate TG125 is in the "H" level, the output of the exclusive OR gate circuit XOR105 is set to the "H" level. As a result, the node N202 is held in the "L" level through the inverters INV181, INV185 and INV187. Therefore, when the transfer gates TG121 and TG129 are set to the ON state, the LSB Y0T of the internal address signal changes from the "L" level to the "H" level as shown in FIG. 4H. On the other hand, the next lower bit Y1T of the internal address signal is held in the "L" level as shown in FIG. 4I. That is, in this manner, the lower bits of the internal address signal are updated by "1" from "0" of the start address to "1".

Moreover, in response to the following clock cycle, the internal address signals obtained by further adding "1" are supplied to the nodes N175 and N202 in response to the internal clock signal ICLK. The supplied internal address signals are transferred to the internal address signal terminals Y0T/Y0N and Y1T/Y1N through the transfer gates TG121 and TG129, as shown in FIGS. 4H and 4I, respectively. That is, the LSB of the internal address signal Y0T is changed from the "H" level to the "L" level. On the other hand, the next lower bit Y1T of the internal address signal is changed from the "L" level to the "H" level. As a result, the lower bits of the internal address (the column address) changes from "1" to "2".

Further, similarly, in the following clock cycle, the internal address is added with "1" from the previous internal address in response to the 1-shot pulse of the internal clock signal ICLK, so that the LSB Y0T of the internal address is changed from the "L" level to the "H" level as shown in FIG. 4H. On the other hand, the next lower bit Y1T of the internal address is held in the "H" level as shown in FIG. 4I. As a result of the lower bits of the internal address changes from "2" to "3".

As described above, in a case where the start address is "0" and the burst length is "4" in the sequential mode, it would be understood that the internal address is incremented in the manner of "0"→"1"→"2"→"3".

Also, while the column selection line signal (CSL) is in the active state, i.e., during the high level period of the signal CSL, access to memory cells having a column address defined by the internal address, i.e., a read or write operation from or to the memory cells is performed, as shown in FIG. 4L. The read operation is shown in FIGS. 4A to 4M. Because the CAS latency is "3", data output DOUT is started at the rising timing of the third clock pulse from the first clock pulse, in response to which the read command has been latched, as shown in FIG. 4M.

Next, in the interleave mode, the mode signal MDBT is present to the "H" level. When a read or write command is inputted, in the first clock cycle, the external address is output just as it is, in the same manner as in the sequential mode. On the other hand, when the inverted signal of the signal MDBT is inputted to one of the input terminals of each of the NAND gate circuits NA109 and NA111, the outputs of the NAND gate circuits NA109 and NA111 are always set to the "H" level, because the signal MDBT is present to the "H" level. The voltage levels of the nodes N171 and N195 which are connected with the outputs of the NAND gate circuits NA109 and NA111 through the transfer gates TG117 and TG125 are set to the "H" level irrespective of the start address. Also, the counter increment signals BCIN0 and BCIN1 are both set to the "L" level.

In the next clock cycle, the transfer gates TG119 and TG127 are turned on in response to 1-shot pulse of the internal clock signal ICLK in the same manner as in the sequential mode. As a result, the node N174 is changed from the "H" level to the "L" level and the node N201 is held to the "H" level. On the other hand, the signal MDBT is present to the "H" level, so that the transfer gates TG120 and TG128 are both turned on. Therefore, in FIG. 1, the result of calculation of the exclusive logic summation of the signals on the nodes N167 and N174 by the exclusive OR gate XOR104 is outputted to the internal address signal terminal Y0T/Y0N. Also, in FIG. 2, the result of calculation of the exclusive logic summation of the signals in the nodes N191 and N201 by the exclusive OR gate XOR106 is outputted to the internal address signal terminal Y1T/Y1N. This operation is logically the same as that the result of the exclusive logic summation calculation of the external address signal bit latched in the first clock cycle and a first data which is always "1" in the sequential mode and a predetermined data in the interleave mode, is outputted as the internal address signal bit.

In the next clock cycle, the first data is further added and as a result of this the result of calculation of the exclusive logic summation of the latched first external address and a second data equal to the twice of the first data is outputted as the internal address signal.

Further, in the next clock cycle, the result of calculation of the exclusive logic summation of the latched first external address and a third data equal to the three times of the first data is outputted as the internal address signal.

In this way, in a case that the burst length is "4" in the interleave mode, when the start address is "0", it could be seen that the internal address advances to be "0"→"1"→"2"→"3".

As described above, in the above conventional example, the internal address can be generated in the column address buffer circuit in the burst operation of the read or write operation. Also, the description when the burst length (BL) is "4" was given. However, using the same column address buffer circuit, the internal addresses can also be generated when the burst (BL) length is "2" or "8" or a full page.

In the above conventional semiconductor memory device, the paths of the internal address signals to be generated are as follows. In the first clock cycle, the 1-shot pulse internal clock signal ICLK is generated in response to the external clock signal CLK, the signal YAL is generated in response to the 1-shot pulse internal clock signal ICLK, the internal address bit signals Y0T/Y0N are generated from the latched external address IA0 and then the internal address bit signal Y1T/Y1N are generated. In the second clock cycle, the 1-shot pulse internal clock signal ICLK is generated in response to the external clock signal CLK, the signal RWCMD is reset in response to the 1-shot internal clock signal ICLK, the internal address bit signals Y0T/Y0N are generated from the latched external address IA0 in response to the resetting of the signal RWCMD, and then the internal address bit signals are generated. In the third clock cycle, the 1-shot pulse internal clock signal ICLK is generated in response to the external clock signal CLK, the counter is incremented in response to the 1-shot internal clock signal ICLK, the internal address bit signals Y0T/Y0N are generated from the latched external address IA0, and then the internal address bit signals are generated. The subsequent internal address bit signals are generated in the same manner as in the third clock cycle. In this manner, in the conventional column address buffer circuit, the paths through which the address signals pass when the internal address signals are generated in response the internal clock signal ICLK are different from each other. Therefore, there is a problem in that it is difficult to adjust the time period from the rising edge of the external clock signal to appearance of the internal address signal. That is, unless the time period required to generate the internal address signal is constant, the "H" level duration time periods of the signal CSL, i.e., the access permission time periods to the memory cells, vary. Therefore, in a case where the time period of the external clock signal CLK is shortened, i.e., the operation frequency is increased, there is a problem in that the maximum frequency is determined based on the shortest "H" level duration time period of the signal CSL. This is because the memory cells having a selected column address need to be accessed during the "H" level time period of the signal CSL. For this reason, the time period of the internal clock signal ICLK is determined based on the shortest time period of the "H" level time periods of the signal CSL.

SUMMARY OF THE INVENTION

The present invention is made under the above circumstances.

An object of the present invention is to provide a semiconductor memory device in which internal addresses can be generated with substantially the same delay time from the external clock signal over all the clock cycles.

Another object of the present invention is to provide a semiconductor memory device in which the internal address to be updated for a next clock cycle is prepared during the current clock cycle.

Still another object of the present invention is to provide a method for generating internal addresses in a synchronous DRAM.

In order to achieve an aspect of the present invention, a semiconductor memory device which operates in synchronous with an external clock signal to generate internal addresses, which are used to access a memory cell array in a burst operation, from an external address in a sequential mode, includes a latching section for latching an external address in response to an external clock signal, a control signal generating section for generating first and second control signals synchronous with the external clock signal, and an internal address generating section for generating an internal address for a first clock cycle of a burst operation from the latched external address in a sequential mode in response to the first control signal, and for generating an internal address for each of a second clock cycle and subsequent clock cycles of the burst operation in the sequential mode in response to a second control signal such that the internal address for each of the second clock cycle and subsequent clock cycles has substantially the same delay time as that of the internal address for the first clock cycle with respect to the external clock signal.

In this case, the control signal generating section includes a first control signal generating section for generating the first control signal based on a command signal for designating a read or write operation, in response to an internal clock signal synchronous with the external clock signal, and a second control signal generating section for generating the second control signal in the burst operation in response to the internal clock signal. Also, the first and second control signals are generated to have substantially the same delay time from a start edge of the external clock signal.

The internal address generating section includes an internal address output flip-flop provided for each of bits of the internal address, and first and second transfer gate circuits provided on first and second transfer paths for each of the bits of the internal address, respectively, and a calculation result flip-flop section provided on each of the second transfer paths to latch the internal address bit for a next clock cycle. The internal address generating section further includes a section for generating the internal address for the first clock cycle by turning on the first transfer gate circuits in response to the first control signal to transfer the latched external address to the internal address output flip-flops, and a section for generating the internal address for each of the second clock cycle and subsequent clock cycle by turning on the second transfer gate circuits in response to the second control signal to transfer the calculation results latched in the calculation result flip-flop sections to the internal address output flip-flops as the internal address.

The internal address generating section may include a section provided for the bits of the internal address other than the LSB, for calculating a value for a second clock cycle from the corresponding bit of the latched external address and a counter increment signal for the internal address bit low next to a corresponding internal address bit in the first clock cycle in the sequential mode in response to the first control signal to store the calculating result in the calculation result flip-flop, and calculating a value for a next clock cycle from the stored calculating result and the counter increment signal in a current clock cycle in the sequential mode to store the calculating result in the calculation result flip-flop. The internal address generating section may include a section provided for the LSB of the internal address, for calculating a value for a second clock cycle from the corresponding bit of the latched external address in the first clock cycle in the sequential mode in response to the first control signal to store the calculating result in the calculation result flip-flop, and calculating a value for a next clock cycle from the latched calculating result in a current clock cycle in the sequential mode to store the calculating result in the calculation result flip-flop. The internal address generating section may include a section provided for the bits of the internal address other than the MSB, for outputting the counter increment signal based on the calculating result latched in the calculation result flip-flop for the internal address bit high next to the corresponding internal address bit in each of the second clock cycle and subsequent clock cycles in the sequential mode in response to the second control signal.

In order to achieve an aspect of the present invention, a semiconductor memory device which operates in synchronous with an external clock signal, includes a memory cell array, a control signal generating section for generating first and second control signals synchronous with an external clock signal in a burst operation in a sequential mode, an external address latching section for latching an external address in response to the external clock signal, an address generating section for generating an internal address for every clock cycle of the burst operation based on the latched external address in the sequential mode in response to one of the first and second control signals for every clock cycle, and an access section for accessing the memory cell array based on each of the generated internal addresses in accordance with an external command signal.

In order to achieve still another aspect of the present invention, a method of generating internal addresses from an external address in a burst operation in a synchronous dynamic random access memory (SDRAM), includes the steps of:

latching an external address in response to an external clock signal;

generating first and second control signals synchronous with the external clock signal;

generating an internal address for a first clock cycle of a burst operation from the latched external address in a sequential mode in response to the first control signal; and generating an internal address for each of a second clock cycle and subsequent clock cycles of the burst operation in the sequential mode in response to a second control signal such that the internal address for each of the second clock cycle and subsequent clock cycles has substantially the same delay time as that of the internal address for the first clock cycle with respect to the external clock signal.

DESCRIPTION OF THE PREFERRED EMBODIMENTS

A semiconductor memory device of the present invention will be described below in detail with reference to the accompanying drawings.

Figure 9:
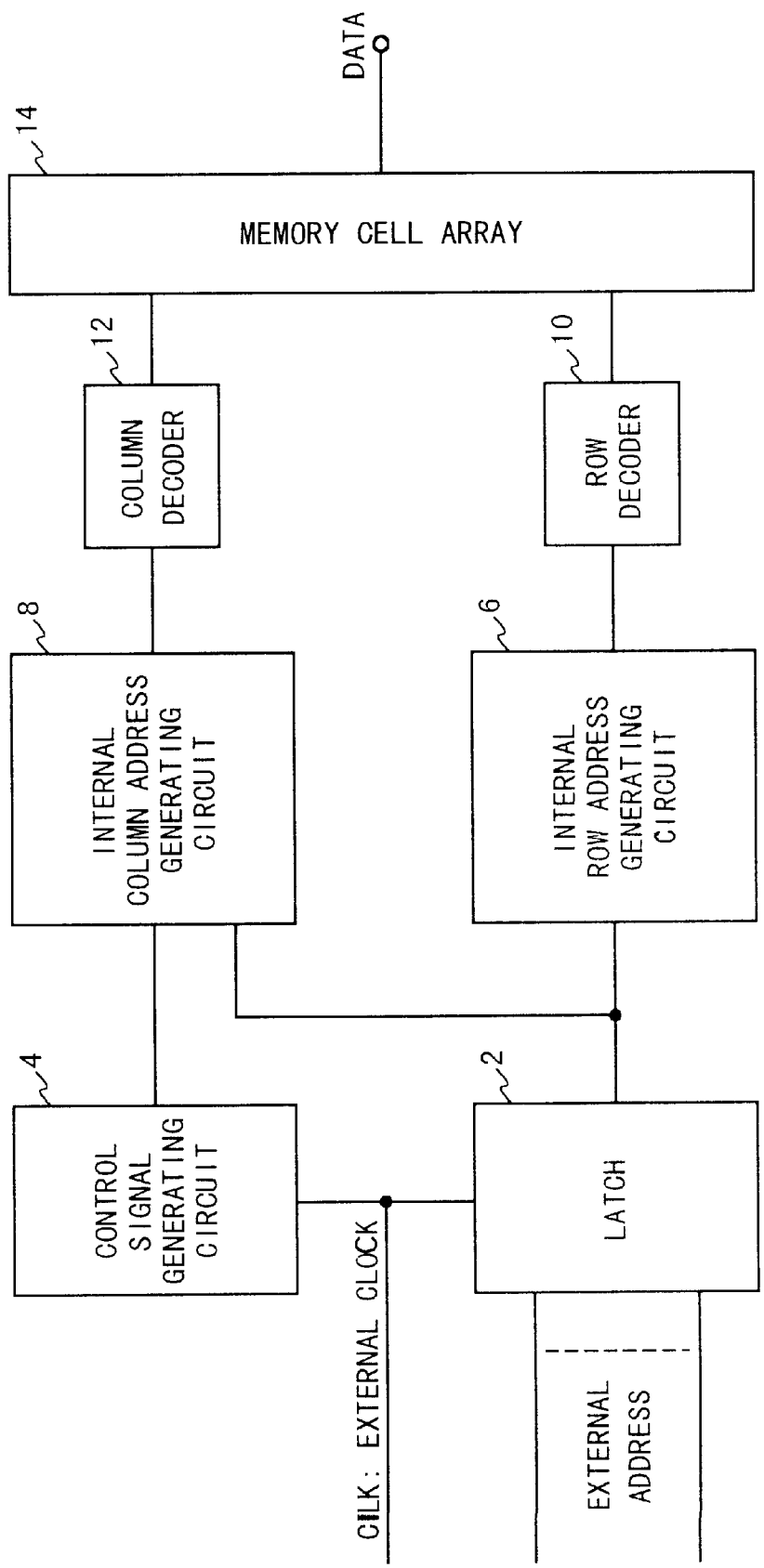
FIG. 9 is a block diagram illustrating the main structure of the SDRAM according to the embodiment of the present invention.

FIG. 9 is a block diagram illustrating a semiconductor memory device such as a synchronous dynamic random access memory (SDRAM) according to an embodiment of the present invention. Referring to FIG. 9, an external address is latched by a latch 2 in synchronous with an external clock signal CLK. The external clock signal CLK is also supplied to a control signal generating circuit 4. The generating circuit 4 generates an internal clock signal ICLK, control signals YAL and NYAL and the like from externally inputted signals in synchronous with the external clock signal CLK. The latched external address is supplied to an internal column address generating circuit 8 and internal row address generating circuit 6. The circuits 6 and 8 generate internal row address and column address which are decoded by a row decoder 10 and column decoder 12, respectively. A memory cell array 14 is accessed based on the generated internal row address and column address.

Figure 5:
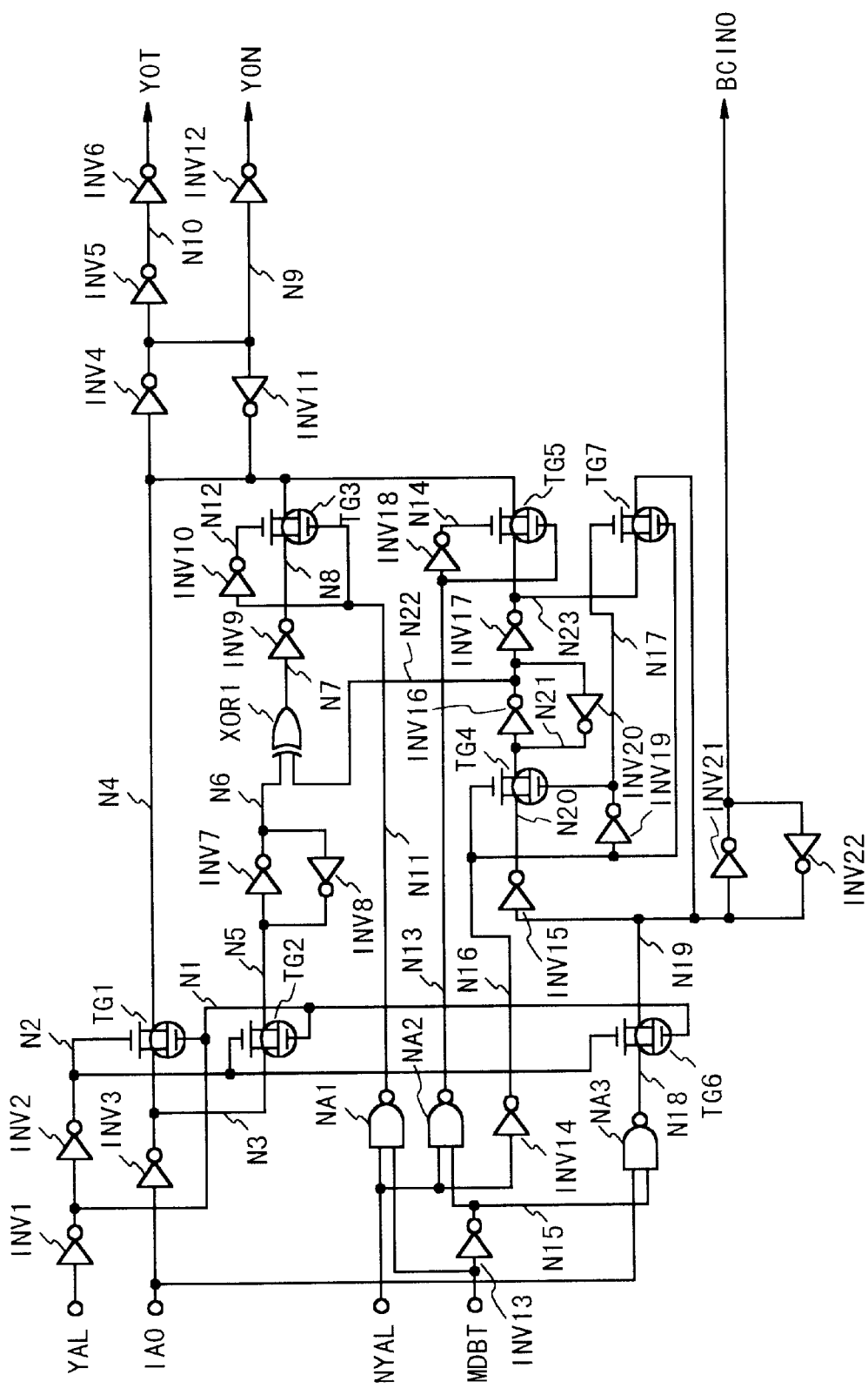
FIG. 5 is a circuit diagram illustrating of the structure of an internal address generating circuit for the least significant bit of an address signal in a column address buffer circuit of an SDRAM according to an embodiment of the present invention.
Figure 6:
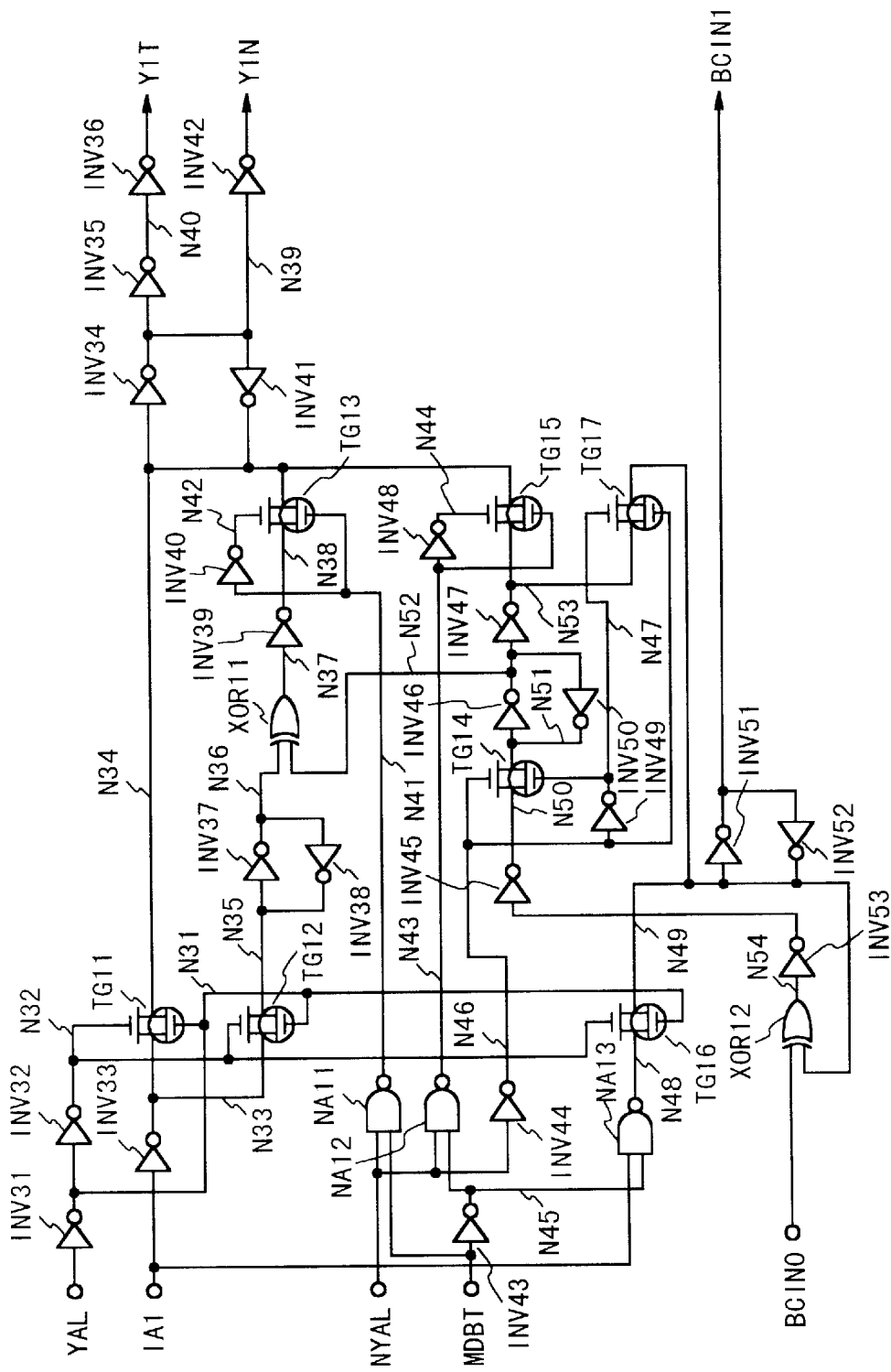
FIG. 6 is a circuit diagram illustrating of the structure of an internal address generating circuit for the next lower bit of the address signal in the column address buffer circuit of the SDRAM according to the embodiment of the present invention.
Figure 7:
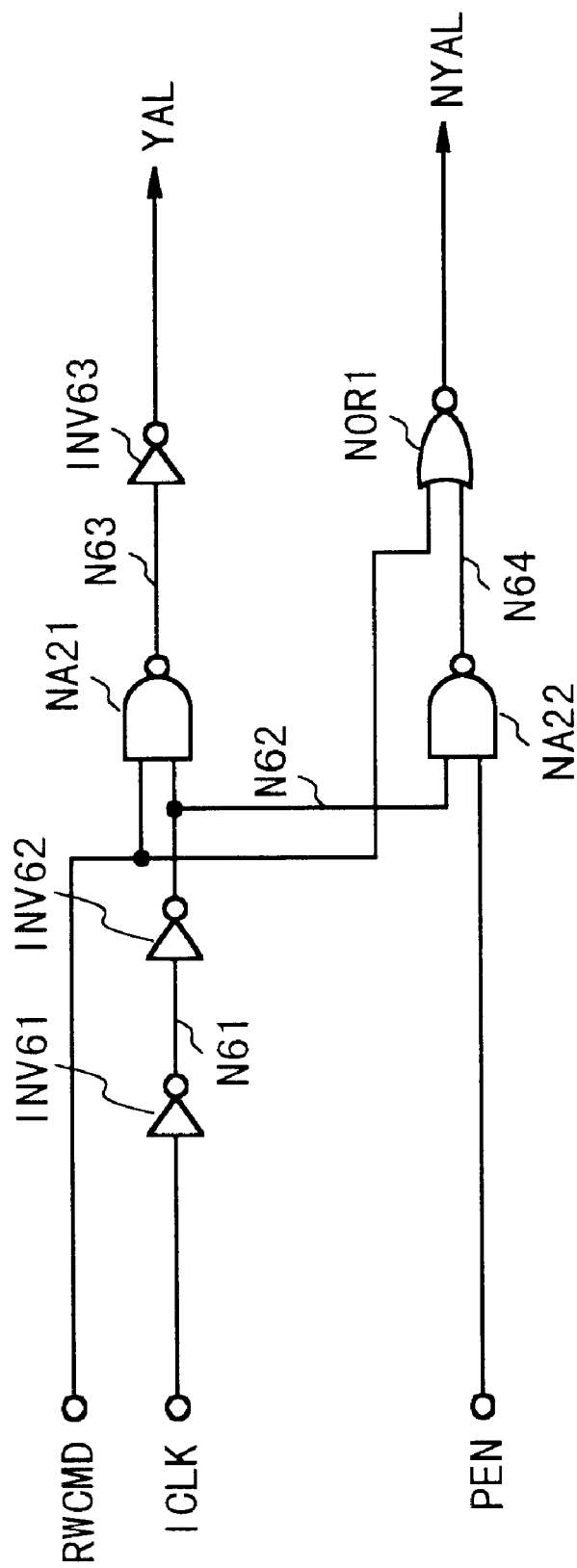
FIG. 7 is a circuit diagram illustrating of the structure of the circuit for generating control signals YAL and NYAL which are used for generation of an internal address during a burst in the SDRAM according to the embodiment of the present invention.

FIGS. 5 and 6 are circuit diagrams illustrating the structure of a part of an internal column address generating circuit or column address buffer circuit of the SDRAM according to the embodiment of the present invention. FIG. 5 shows the structure of the column address generating circuit for the lowest bit or the LSB Y0T of an internal address, and FIG. 6 shows the structure of the column address generating circuit for the next lower bit Y1T from the LSB. A counter increment signal BCIN0 of FIG. 5 is supplied to the circuit shown in FIG. 6. FIG. 7 is a circuit diagram of a part of the control signal generating circuit 4 for generating the control signals YAL and NYAL which are used in the circuits of FIGS. 5 and 6.

In FIGS. 5 to 7, reference symbols INV1 to INV63 denote inverter circuits, NOR1 denotes a NOR gate circuit, NA1 to NA22 denote NAND gate circuits, and XOR1 to XOR12 denote exclusive logic summation (exclusive OR) gate circuits. Reference symbols TG1 to TG17 denote CMOS transfer gate circuits which each are composed of an N-channel MOS transistor and a P-channel MOS transistor. Reference symbols N1 to N64 denote nodes.

A signal MDBT designates a sequential mode in which the internal addresses are sequentially generated when the signal MDBT is in the "L" level, and an interleave mode in which the internal addresses are generated such that the internal address is incremented by a predetermined data, when the signal MDBT is in the "H" level. A control signal RWCMD is a read or write command signal. A control signal YAL is the signal which is used to take an external address signal into the column address generating circuit in the first clock cycle of a burst operation and to generate an internal address signal based on the taken-in external address signal. A control signal NYAL is the signal which is used to generate the internal addresses in the second clock cycle and subsequent clock cycles in the burst operation. Signals IA0 and IA1 are the least significant bit (LSB) and next lower bit of the external address signal to be latched, respectively. A signal ICLK is the internal clock signal which has a 1-shot pulse generated in response to the rising edge of each pulse of an external clock signal CLK. A signal PEN is the internal burst permission signal, and while the signal PEN is in the "H" level, the column address buffer circuit performs the burst operation. Signal Y0T and Y1T are the LSB and next lower bit of the internal address signal and signals Y0N and Y1N are the inversion signals of the signals Y0T and Y1T, respectively. Signals BCIN0 and BCIN1 are counter increment signals which are used for the column address generating circuits of the second and third lower bits of the internal address, respectively.

Next, the structure of the column address buffer circuit to the LSB Y0T of the internal address will be described with reference to FIG. 5. The LSB IA0 of the external address signal, or the output of the inverter INV3 is supplied to and latched in an internal address output flip-flop circuit composed of the inverters INV4 and INV11 through the transfer gate TG1 which is controlled by the control signal YAL. The output of the inverter INV4 is connected to a terminal of the internal address signal for the LSB Y0T via the inverters INV5 and INV6. Also, the output of the inverter INV4 is connected to another terminal of the internal address signal for the inverted bit of the LSB via the inverter INV12. The LSB IA0 of the external address signal, or the output of the inverter INV3 is also supplied to and latched in a first flip-flop circuit composed of the inverters INV7 and INV8 through the transfer gate TG2 which is controlled by the control signal YAL. Further, the LSB IA0 of the external address signal is supplied to and latched in a second flip-flop circuit, for latching a calculation result, composed of the inverters INV16 and INV20 through the NAND gate circuit NA3 using the inversion signal of the signal MDBT as a gate control signal, the transfer gate TG6 which is controlled by the control signal YAL, the inverter INV15, and the transfer gate TG4 which is controlled by the control signal NYAL. The input of the second flip-flop is the node N21. The output of the inverter INV16 constituting the second flip-flop is connected to one of the inputs of the exclusive OR gate circuit XOR1. The output of the inverter INV7 constituting the first flip-flop is connected to the other input of the exclusive OR gate circuit XOR1. The output of the inverter INV7 is the node N6. The output of the exclusive OR gate circuit XOR1 is connected to the above-mentioned address output flip-flop through the inverter INV9 and the transfer gate TG3 which is controlled by the control signals MDBT and NYAL. The output of the inverter INV16 constituting the second flip-flop is connected to the address output flip-flop through the inverter INV17 and the transfer gate TG5 which is controlled by the control signals NYAL and MDBT. The output of the transfer gate TG6, i.e., the node N19, is connected to an increment signal flip-flop composed of the inverters INV21 and INV22 and the output of the inverter INV21 is used as the counter increment signal BCIN0. The output of the second flip-flop is connected to the increment signal flip-flop and the node N19 through the inverter INV17 and the transfer gate TG7 which is controlled by the control signal NYAL.

Next, the structure of the column address buffer circuit for the second lower bit Y1 of the internal address signal will be described with reference to FIG. 6. In FIG. 6, the inverters INV31 to INV52 correspond to the inverters INV1 to INV22 in FIG. 5, the transfer gates TG11 to TG17 correspond to the transfer gates TG1 to TG7, the NAND gate circuits NA11 to NA13 correspond to the NAND gate circuits NA1 to NA3, and the exclusive OR gate circuit XOR11 corresponds to the exclusive OR gate circuit XOR1. The different points between the circuit of FIG. 5 and the circuit of FIG. 6 are as follows. The new exclusive OR gate circuit XOR12 is provided and the counter increment signal BCIN0 is supplied to one of the input terminals of the exclusive OR gate circuit XOR12. The output of the transfer gate TG16 which corresponds to the transfer gate TG6 in FIG. 5 is not connected to the inverter INV45 which corresponds to the inverter INV15, but rather is connected to the other input terminal of the exclusive OR gate circuit XOR12. Also, the output of the transfer gate TG16 is connected to the increment signal flip-flop composed of INV51 and INV52. The output of the exclusive OR gate circuit XOR12 is connected via the inverter INV53 to the inverter INV45 which corresponds to the inverter INV15 in FIG. 5. The output of the increment signal flip-flop is supplied as the counter increment signal BCIN1, which is supplied to a column address generating circuit or the column address buffer circuit for the third lower bit Y2T of the internal address signal in a case of the burst length of "8", for example.

Figure 3:
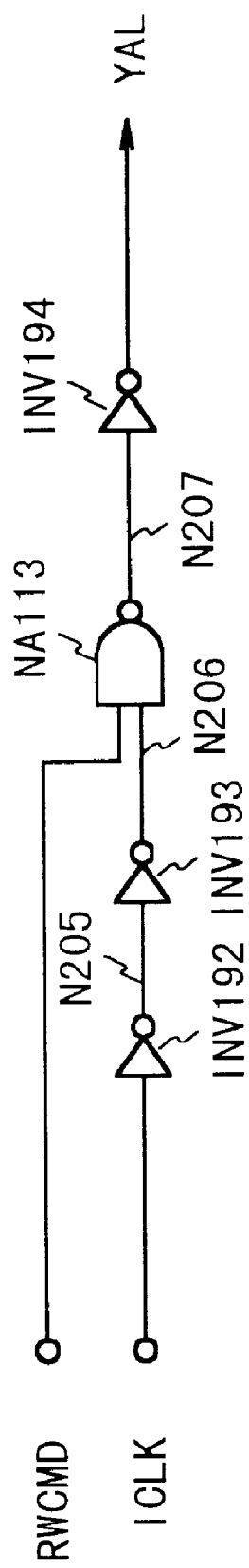
FIG. 3 is a circuit diagram illustrating of the structure of the circuit for generating a control signal YAL which is used for generation of an internal address in the first clock cycle of a burst in the conventional SDRAM.
Figure 4:
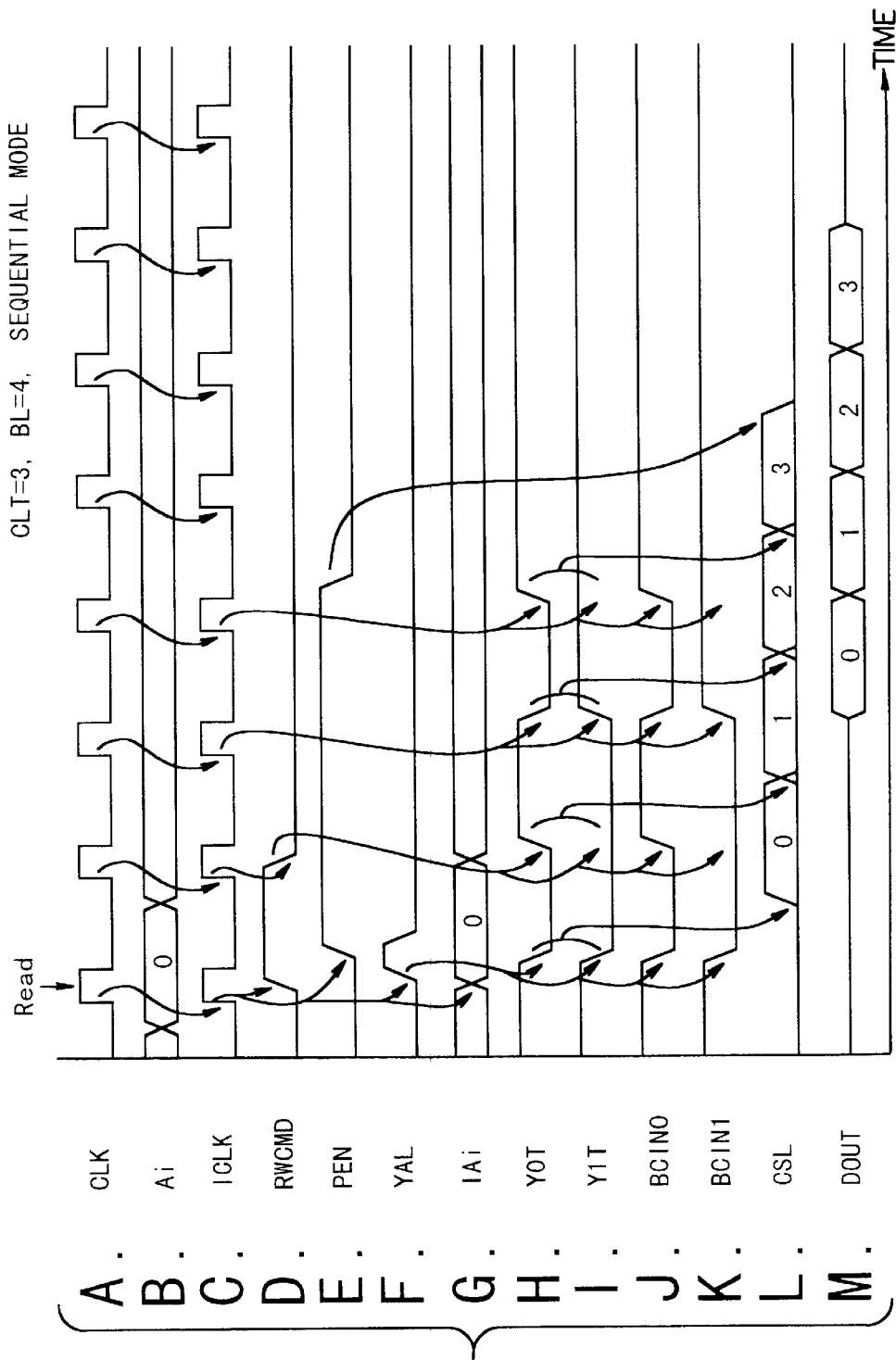
FIG. 4 is a timing chart of various portions of the column address buffer circuit for explaining the operation of the column address buffer circuit in the conventional SDRAM.

Next, referring to FIG. 7, the control signal YAL is generated from the internal clock signal ICLK and the signal RWCMD as in the circuit shown in FIG. 3. That is, the internal clock signal ICLK is supplied to one of the inputs of the NAND gate circuit NA21 via the inverters INV61 and INV62. The other input of the NAND gate circuit NA21 is supplied with the signal RWCMD. The output of the NAND gate circuit NA21 is supplied via the inverter INV63 as the signal YAL. Also, one input of the NAND gate circuit NA22 is supplied with the internal clock signal ICLK via the inverters INV61 and INV62. The other input of the NAND gate circuit NA22 is supplied with the signal PEN and the output of the NAND gate circuit NA22 is supplied to one input of the NOR gate NOR1. The other input of the NOR gate circuit NOR1 is supplied with the signal RWCMD. The output of the NOR gate circuit NOR1 is supplied as the signal NYAL.

When the signal RWCMD is the "L" level, the internal burst permission signal PEN is active, i.e., in "H" level. Accordingly, when the internal clock signal ICLK changes from the "L" level to the "H" level and then from "H" level to the "L" level, the output of the NAND gate circuit NA22 changes from "H" level to "L" level and then from "L" level to the "H" level. As a result, the signal NYAL as the output of the NOR gate circuit NOR1 changes from the "L" level to the "H" level and then from the "H" level to the "L" level. Thus, the control signal NYAL is generated.

Figure 1:
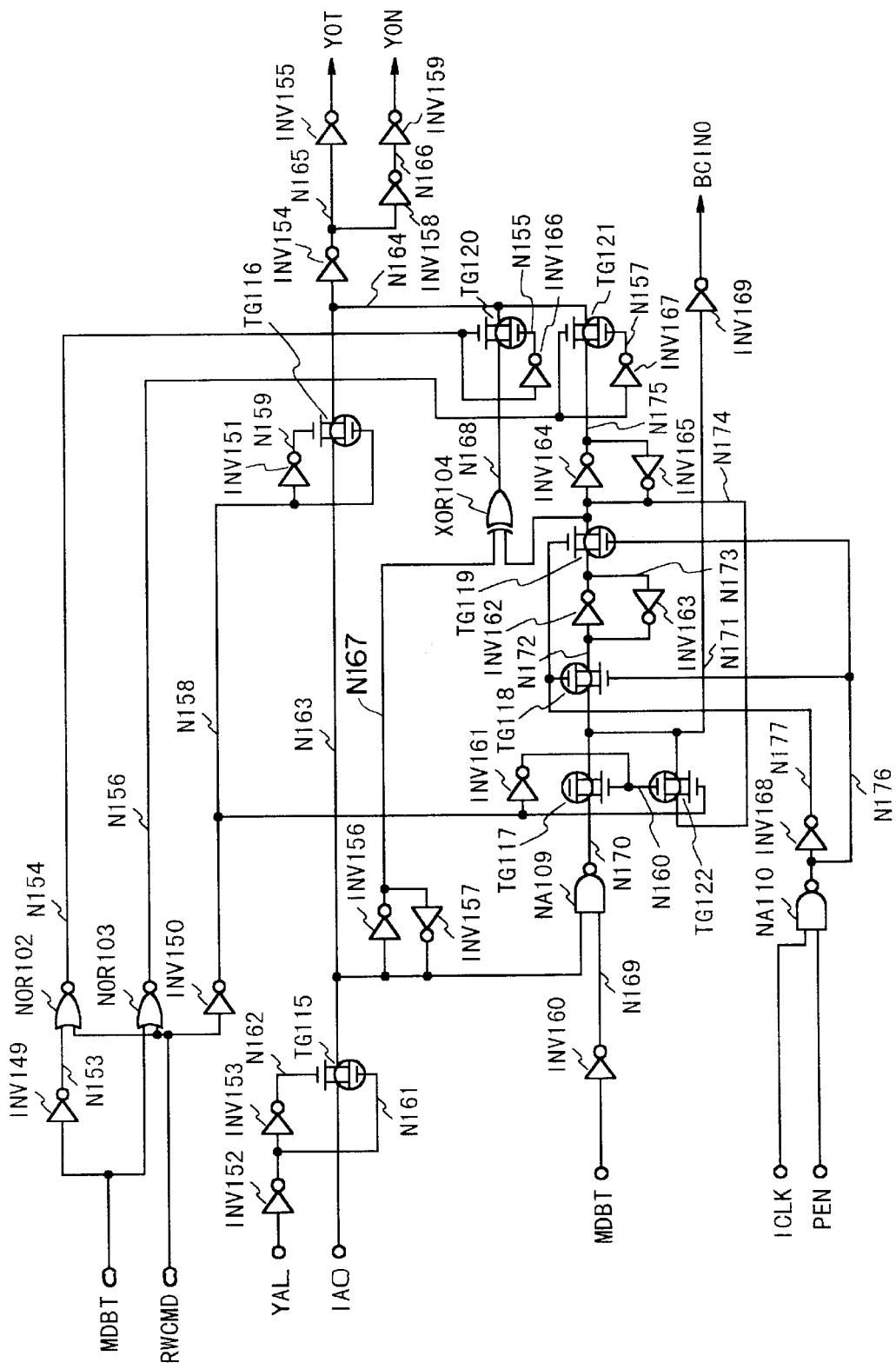
FIG. 1 is a circuit diagram illustrating of the structure of an internal address generating circuit for the least significant bit of an address signal in a column address buffer circuit of a conventional synchronous dynamic random access memory (SDRAM)
Figure 2:
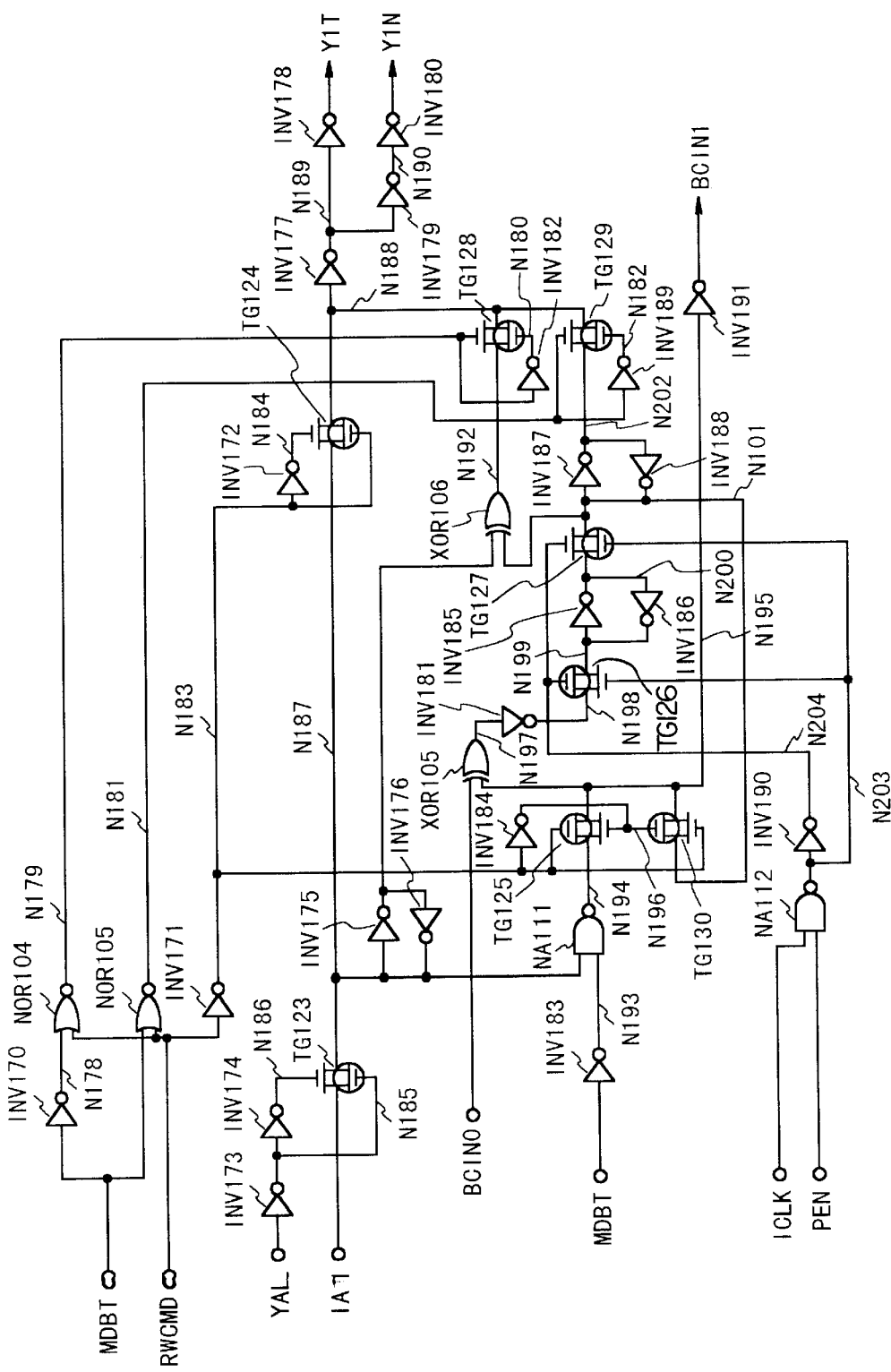
FIG. 2 is a circuit diagram illustrating of the structure of an internal address generating circuit for the next lower bit of the address signal in the column address buffer circuit of the conventional SDRAM.

In this manner, there is the main difference between the first embodiment of the present invention which is shown in FIGS. 5 and 6 and the above-mentioned conventional example which is shown in FIGS. 1 and 2 in that there are provided the transfer gates TG2 and TG12 which are controlled by the YAL signal, in addition to the transfer gate circuits TG1 and TG11 which are provided on the path to the internal address signal terminals Y0T/Y0N and Y1T/Y1N from the external address signal bits IA0 and IA1, and that there is provided the internal address signal generation control signal NYAL for the second clock cycle and the subsequent clock cycles during the burst operation.

As seen from FIG. 7, the control signal YAL is generated through three inverters and one NAND gate circuit using the internal clock signal ICLK, and the control signal NYAL is generated through two inverters, one NAND gate circuit and one NOR gate circuit using the internal clock signal ICLK. Therefore, the control signals YAL and NYAL are generated in synchronous with the internal clock signal ICLK which is generated in synchronous with the external clock signal CLK, such that both the control signals YAL and NYAL have substantially the same delay time from the external clock signal CLK.

Further, the latched external address bit signals IA0 and IA1 are connected to the internal address output flip-flop through only one stage of transfer gate. Also, the calculation result latched in the second flip-flop is connected to the internal address output flip-flop through only one stage of transfer gate. Therefore, the internal address can be supplied to the internal address output flip-flops over all the bits such that the internal addresses have the same delay time over all the clock cycles of the burst operation.

Next, the operation of the column address buffer circuit of the SDRAM according to the embodiment of the present invention will be described with reference to FIGS. 8A to 8N. For simple description, assume that the CAS latency (CLT) is "3" and the burst length (BL) is "4".

First, the operation in the sequential mode will be described below. In the sequential mode, the signal MDBT is preset to the "L" level.

Figure 8:
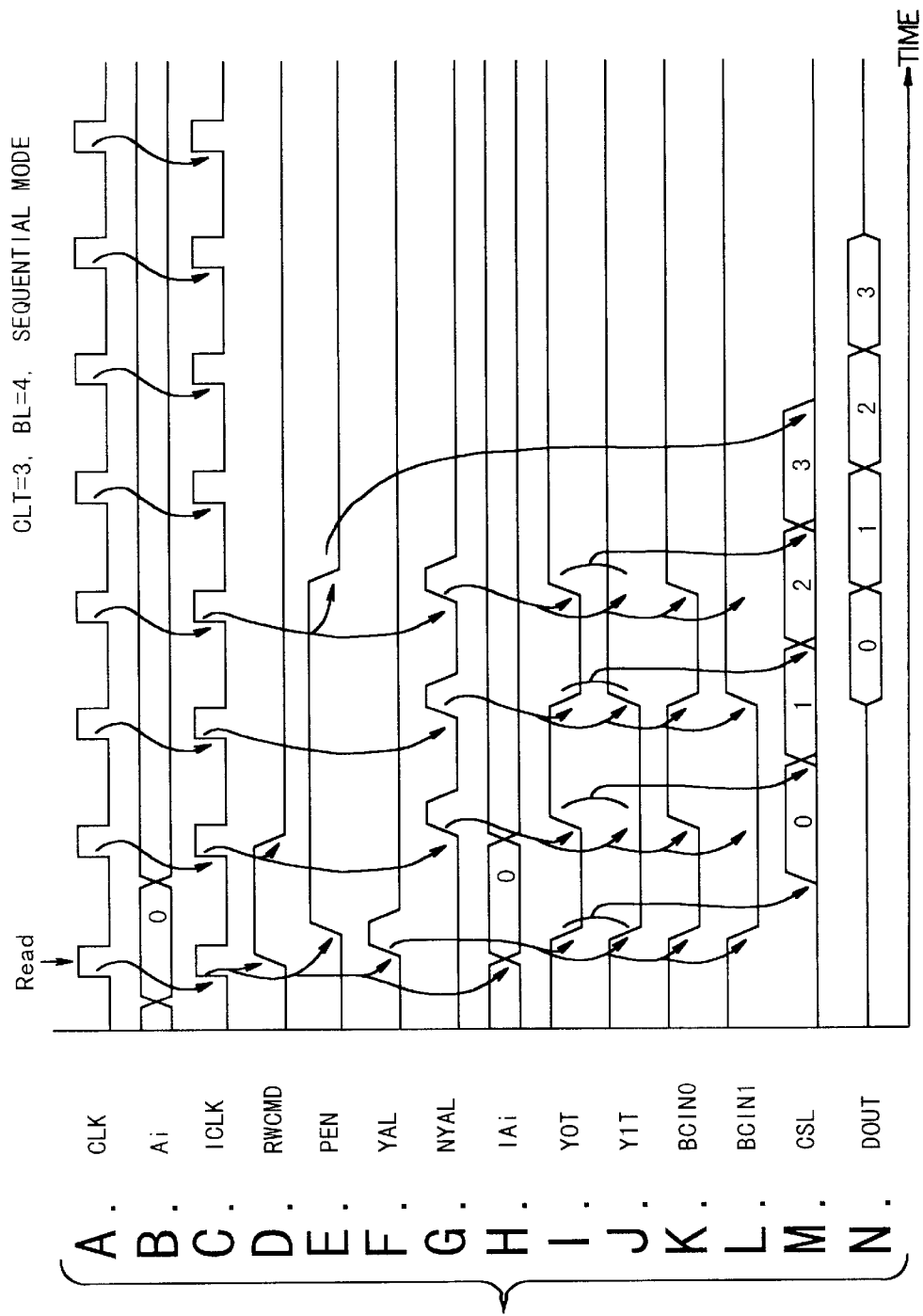
FIG. 8 is a timing chart of various portions of the column address buffer circuit for explaining the operation of the column address buffer circuit in the SDRAM according to the embodiment of the present invention.

First, when a read or write command (a read command in FIG. 8A) is latched, the read/write command signal RWCMD is set to the "H" level during the period of the first clock cycle, as shown in FIG. 8D. While the read/write command signal RWCMD is in the "H" level, the 1-shot pulse of the internal clock signal ICLK is generated in synchronous with the rising edge of the external clock signal CLK in the circuit 4 of FIG. 7, and as the result of this the signal YAL of the 1-shot pulse is generated, as shown in FIG. 8F. Therefore, the transfer gates TG1, TG2, TG6, TG11, TG12 and TG16 are set to the ON state. Since the transfer gates TG1 and TG11 are set to the ON state, the external address signal bits IA0 and IA1 shown in FIG. 8B are outputted as the internal address signal bits Y0T/Y0N and Y1T/Y1N in the first clock cycle of the burst operation, as shown in FIGS. 8I and 8J. Also, since the transfer gates TG6 and TG16 are set to the ON state, the external address signal bit IA0 is supplied to the inverter INV15 and the increment signal flip-flop composed of the inverters INV21 and INV22 through the NAND gate circuit NA3 and the transfer gate circuit TG6. Therefore, the inversion signal of the output of the transfer gate TG6 is outputted as the counter increment signal BCIN0, as shown in FIG. 8K. Also, because the signal NYAL is in the "L" as shown in FIG. 8G, the output of the inverter INV15 is supplied to and latched by the second flip-flop composed of the inverters INV16 and INV20 through the transfer gate TG4. Thereby, the data of the internal address signal bit for the next clock cycle of the burst operation, i.e., the bit data of the internal address obtained by adding "1" to the start external address, is outputted from the second flip-flop. In this case, the voltages of the nodes N19 and N49 which are the output terminals of the transfer gates TG6 and TG16 are both set to the "H" level, and the counter increment signals BCIN0 and BCIN1 are both in the "L" level. Therefore, the voltage of the node N23 which is the input terminal at the transfer gate TG7 of FIG. 5 is set to the "L" level and the voltage of the node N53 which is the input terminal at the transfer gate TG17 of FIG. 6 is remained in the "H" level. On the other hand, the internal burst permission signal PEN is changed from the "L" level to the "H" level with a little time interval after the signal RWCMD is changed from the "L" level to the "H" level. In this manner, the internal address for the next clock cycle can be prepared during the current clock cycle.

Further, since the transfer gates TG2 and TG12 are set to the ON state, the external start address is latched in the first flip-flops composed of the inverters INV7 and INV8 and the inverters INV17 and INV18 and the outputs of the inverters INV7 and INV17 are supplied to one inputs of the exclusive OR gate circuits XOR1 and XOR11. The other inputs of the exclusive OR gate circuits XOR1 and XOR11 are supplied with the outputs of the second flip-flops. However, because the control signal MDBT is in the "L" level, so that the transfer gates TG3 and TG13 are in the OFF state, the outputs of the first flip-flops are not supplied to the internal address output flip-flops.

When the signal RWCMD is changed from the "H" level to the "L" level in response to the next clock cycle of the clock signal, as shown in FIG. 8D, a 1-shot pulse of the internal clock signal ICLK is generated so that a 1-shot pulse of the control signal NYAL is generated instead of the control signal YAL as shown in FIG. 8G. At this time, since the signal MDBT is in the "L" level, the transfer gates TG5 and TG15 are both set to the ON state. As a result, the internal address bit signal Y0T is changed from the "L" level to the "H" level as shown in FIG. 8I and the internal address bit signal Y1T remains held in the "L" level as shown in FIG. 8J. Thus, the internal address signal in which "1" is added to the start address is obtained.

On the other hand, since the transfer gate TG7 and TG17 are set to the ON state, the voltage of the node N19 is also changed from the "H" level to the "L" level. Further, the counter increment signal BCIN0 is changed from the "L" level to "H" level such that "1" is added to the signal BCIN0, as shown in FIG. 8K. Furthermore, although the transfer gate TG17 is also set to the ON state, the voltage of the node N49 is held in the "H" level. However, when the signal NYAL is thereafter changed from the "H" level to "L" level, the transfer gate TG14 is set to the ON state. Accordingly, the voltage of the node N53 is changed from the "H" level to the "L" level. On the other hand, since the transfer gate TG4 is also set to the ON state, the voltage of the node N23 is changed from the "H" level to the "L" level.

Further, in the next third clock cycle, when a 1-shot pulse of the control signal NYAL is generated as described above as shown in FIG. 8G, since the transfer gates TG5 and TG15 are both set to the ON state again, the LSB Y0T of the internal address signal is changed from "H" level to the "L" level, as shown in FIG. 8I, and the next lower bit Y1T of the internal address signal is changed from the "L" level to the "H" level, as shown in FIG. 8J. That is, the internal address is incremented from "1" to "2".

In the next fourth clock cycle, as described above, a 1-shot pulse of the control signal NYAL is generated so that the internal address is further incremented by "1". That is, the LSB Y0T of the internal address is changed from "L" level to the "H" level as shown in FIG. 8I and the next lower bit Y1T of the internal address remains held in the "H" level as shown in FIG. 8J, so that the internal address is incremented from "2" to "3".

As described above, in a case where the burst length is "4" and the start address is "0" in the sequential mode, the internal address is incremented in a manner of ("0"→"1"→"2"→"3").

Also, FIG. 8M shows a wave form of a column select line (CSL) signal. In the signal CSL, the external address is used as the internal address as it is in the first clock cycle in response to the control signal YAL. The incremented internal address is generated in each of the second clock cycle and subsequent clock cycles in response to the control signal NYAL. Further, the column address generating circuit of the present invention is designed in such a manner that the time from the rising edge of the 1-shot pulse of the internal clock signal ICLK to when the internal address is generated is substantially the same between the first clock cycle and each of the second clock cycle and subsequent clock cycles. Note that the operation from the signal CSL to the data output DOUT is the same as in the above conventional SDRAM, as shown in FIGS. 8M and 8N.

Next, in the case of the interleave mode, the signal MDBT is preset to the "H" level.

When a read or write command is inputted, the external address is outputted as the internal address as it is, in the clock cycle, as in the sequential mode. Also, the information of the start address is latched at the nodes N6 and N36. On the other hand, since the signal MDBT is prefixed to "H" level, the outputs of the NAND gate circuits NA3 and NA13 are always in the "H" level. Therefore, the voltages or logic levels of the nodes N19 and N49 are in the "H" level regardless of the start address. Also, the counter increment signals BCIN0 and BCIN1 are set to the "L" level together.

Further, the inverted signal of the result of the exclusive logic summation calculation by the exclusive OR gate circuit XOR1 which has as inputs the logic level of the node N6 which is the output of the inverter INV7 and the logic level of the node N22 which is the output of the inverter INV16, is transferred to the node N8 in FIG. 5. In this case, the logic level of the node N8 is the "L" level. On the other hand, the inverted signal of the result of the exclusive logic summation calculation by the exclusive OR gate circuit XOR11 which has as inputs the logic level of the node N36 which is the output of the inverter INV37 and the logic level of the node N52 which is the output of the inverter INV46, is transferred to the node N38 in FIG. 6. In this case, the logic level of the node N31 is the "H" level.

In the next second clock cycle, since a 1-shot pulse of the signal NYAL is generated instead of the address latch control signal YAL, the transfer gates TG3 and TG13 are both set to the ON state, so that the LSB Y0T of the internal address is changed from the "L" level to the "H" level. However, the next lower bit Y1T of the internal address remains held in the "L" level. This operation is logically equivalent to that the result of exclusive logic summation calculation of the external address latched in the first clock cycle as the start address and the first data is outputted as the internal address, as in the above conventional example.

Similarly, in the next clock cycle, because the first data is added with "1", the result of the exclusive logic summation calculation of the start address and the second data is outputted as the internal address.

Further, in the next third clock cycle, the result of the exclusive logic summation calculation of the start address and the third data is outputted as the internal address.

As described above, in a case where the burst length is "4" in the interleave mode and the start address is "0", the internal address is incremented in such a manner of ("0"→"1"→"2"→"3")

In the present embodiment described above, the generation of the internal address at the read or write operation in the burst operation can be performed only by the column address buffer circuit or internal column address generating circuit. The read or write operation in the first clock cycle of the burst operation is executed in response to the rising edge of the control signal YAL and the read or write operation in the second clock cycle and subsequent clock cycles is executed in response to the rising edge of the control signal NYAL. Accordingly, the timings when the internal addresses are generated in the second clock cycle and subsequent clock cycles are constant with respect to the rising edge of the external clock signal CLK. In addition, the timing when the internal address is generated in the first clock cycle and the timings when the internal addresses are generated in the second clock cycle and subsequent clock cycles can be easily set to the same value with respect to the rising edge of the external clock signal CLK. That is, in the present embodiment, the transfer gates TG1 and TG2 in FIG. 5 and TG11 and TG12 in FIG. 6 are provided to separate the flip-flops which are respectively composed of the inverters INV7 and INV8, and INV17 and 1NV38 and which latch the start address bits, from the internal address generation path in the sequential mode. Accordingly, the internal address in the first clock cycle is generated in response to the control signal YAL which is generated in response to the internal clock signal ICLK and transferred through one transfer gate, and latched by the internal address output flip-flop which is composed of the inverters INV4 and INV11 or INV34 and INV41. The internal address in each of the second clock cycle and subsequent clock cycles is generated in response to the control signal NYAL which is generated in response to the internal clock signal ICLK and transferred to the internal address output flip-flop which is composed of the inverters INV4 and INV11 or INV34 and INV41 through one transfer gate. In this manner, the internal addresses can be generated at the same timing from the rising edge of the external clock signal CLK over all the clock cycles. Therefore, the time width of the internal address for each clock cycle and the "H" level duration of the CSL (column select line) can be the same over all the clock cycles. As a result, the operation frequency can be easily increased up to the maximum level of internal operation.

Note that although only the operation when the burst length (BL) is "4" is described, the internal address can be generated in the same manner by introducing the similar column address buffer circuit even when the burst length is "2" or a "8" or full page.

What is claimed is:

1. A semiconductor memory device which operates in synchronous with an external clock signal, comprising:

a memory cell array;

control signal generating means for generating first and second control signals synchronous with the external clock signal in a burst operation in a sequential mode;

external address latching means for latching an external address in response to the external clock signal;

address generating means for generating an internal address for every clock cycle of the burst operation based on the latched external address in the sequential mode in response to one of the first and second control signals for every clock cycle; and access means for accessing the memory cell array based on each of the generated internal addresses in accordance with an external command signal, wherein the first and second control signals are generated to have substantially the same delay time from a start edge of the external clock signal, wherein the internal address generated for every clock cycle of the burst operation is generated at substantially the same time period from the generation of the corresponding one of the first and second control signals, wherein the address generating means includes an internal address generating circuit for each of bits of the internal address, the address generating means including a counter for generating a counter increment signal, and wherein each of the internal address generating circuits includes:

an internal address flip-flop for latching the corresponding bit of the internal address to output the latched bit;

a first transfer path having a first transfer gate circuit and connected to the corresponding bit of the latched external address, wherein the first transfer gate circuit is turned on in a first clock cycle in response to the first control signal such that the corresponding external address bit is outputted to said internal address flip-flop as the corresponding internal address bit; and a second transfer path having a calculation result flip-flop and a second transfer gate circuit and connected to the corresponding bit of the latched external address, wherein the calculation result flip-flop calculates a value for a second clock cycle from the corresponding bit of the latched external address and the counter increment signal supplied from the internal address generating circuit for the internal address bit next lowest with respect to the corresponding internal address bit in said first clock cycle in the sequential mode in response to the first control signal to latch the calculating result, and calculates a value for a next clock cycle from the latched calculating result and the counter increment signal in a current clock cycle in the sequential mode to latch the calculating result, and the second transfer gate circuit is turned on in each of a second clock cycle and subsequent clock cycles in response to the second control signal such that the latched calculating result is outputted to the internal address flip-flop as the corresponding internal address bit.

2. A method of generating internal addresses from an external address in a burst operation in a synchronous dynamic random access memory (SDRAM), comprising the steps of:

latching an external address in response to an external clock signal;

generating first and second control signals synchronous with the external clock signal;

generating an internal address for a first clock cycle of a burst operation from the latched external address in a sequential mode in response to the first control signal; and generating an internal address for each of a second clock cycle and subsequent clock cycles of the burst operation in the sequential mode in response to the second control signal such that the internal address for each of the second clock cycle and subsequent clock cycles has substantially the same delay time as that of the internal address for the first clock cycle with respect to the external clock signal, wherein the first and second control signals have substantially the same delay time from a start edge of the external clock signal, wherein the internal address generated for every clock cycle of the burst operation is generated at substantially the same time period from the generation of the corresponding one of the first and second control signals, wherein an internal address output flip-flop is provided for each of bits of the internal address, and first and second transfer gate circuits are provided on first and second transfer paths for each of the bits of the internal address, respectively, and a calculation result flip-flop is provided on the second transfer path to latch the internal address bit for a next clock cycle, wherein the step of generating an internal address for a first clock cycle includes generating the internal address for the first clock cycle by turning on the first transfer gate circuit in response to the first control signal to transfer the latched external address to the internal address output flip-flop, wherein the step of generating an internal address for each of a second clock cycle and subsequent clock cycles includes generating the internal address for each of the second clock cycle and subsequent clock cycles by turning on the second transfer gate circuit in response to the second control signal to transfer the calculation result latched in the calculation result flip-flop section to the internal address output flip-flop as the internal address, and wherein the step of generating an internal address for each of a second clock cycle and subsequent clock cycles includes, for the bits of the internal address other than the LSB, calculating a value for a second clock cycle from the corresponding bit of the latched external address and a counter increment signal for the internal address bit next lowest with respect to a corresponding internal address bit in the first clock cycle in the sequential mode in response to the first control signal to latch the calculating result in the calculation result flip-flop, and calculating a value for a next clock cycle from the latched calculating result and the counter increment signal in a current clock cycle in the sequential mode to latch the calculating result in the calculation result flip-flop.

3. A method according to claim 2, wherein the step of generating an internal address for each of a second clock cycle and subsequent clock cycles includes, for the LSB of the internal address, calculating a value for a second clock cycle from the corresponding bit of the latched external address in the first clock cycle in the sequential mode in response to the first control signal to latch the calculating result in the calculation result flip-flop, and calculating a value for a next clock cycle from the latched calculating result in a current clock cycle in the sequential mode to latch the calculating result in the calculation result flip-flop.

4. A method according to claim 2, wherein the step of generating an internal address for each of a second clock cycle and subsequent clock cycles includes, for the bits of the internal address other than the MSB, outputting the counter increment signal based on the calculating result latched in the calculation result flip-flop for the internal address next highest with respect to the corresponding internal address bit in each of the second clock cycle and subsequent clock cycles in the sequential mode in response to the second control signal.

5. A semiconductor memory device which operates in synchronous with an external clock signal to generate internal addresses, which are used to access a memory cell array in a burst operation, from an external address in a sequential array, comprising:

latching means for latching an external address in response to an external clock signal;

control signal generating means for generating first and second control signals synchronous with the external clock signal; and internal address generating means for generating an internal address for a first clock cycle of a burst operation from the latched external address in a sequential mode in response to the first control signal, and for generating an internal address for each of a second clock cycle and subsequent clock cycles of the burst operation in the sequential mode in response to the second control signal such that the internal address for each of the second clock cycle and subsequent clock cycles has substantially the same delay time as that of the internal address for the first clock cycle with respect to the external clock signal, wherein the control signal generating means generates the first and second control signals to have substantially the same delay time from a start edge of the external clock signal, and wherein the internal address generated for every clock cycle of the burst operation is generated at substantially the same time period from the generation of the corresponding one of the first and second control signals, wherein the internal address generating means includes an internal address output flip-flop provided for each of bits of the internal address, and first and second transfer gate circuits provided on first and second transfer paths for each of the bits of the internal address, respectively, and a calculation result flip-flop section provided on each of the second transfer paths to latch the internal address bit for a next clock cycle, and wherein the internal address generating means includes:
means for generating the internal address for the first clock cycle by turning on the first transfer gate circuit in response to the first control signal to transfer the latched external address to the internal address output flip-flop, and means for generating the internal address for each of the second clock cycle and subsequent clock cycles by turning on the second transfer gate circuit in response to the second control signal to transfer the calculation result latched in the calculation result flip-flop section to the internal address output flip-flop as the internal address, wherein the internal address generating means includes:
a counter for generating a counter increment signal;
means provided for the bits of the internal address other than the LSB, for calculating a value for a second clock cycle from the corresponding bit of the latched external address and the counter increment signal for the internal address bit next lowest with respect to a corresponding internal address bit in the first clock cycle in the sequential mode in response to the first control signal to store the calculating result in the calculation result flip-flop, and calculating a value for a next clock cycle from the stored calculating result and the counter increment signal in a current clock cycle in the sequential mode to store the calculating result in the calculation result flip-flop, and wherein the internal address generating means includes:
means provided for the bits of the internal address other than the MSB, for outputting the counter increment signal based on the calculating result latched in the calculation result flip-flop for the internal address bit high next to the corresponding internal address bit in each of the second clock cycle and subsequent clock cycles in the sequential mode in response to the second control signal.

6. A semiconductor memory device according to claim 5, wherein the internal address generating means includes:

means provided for the LSB of the internal address, for calculating a value for a second clock cycle from the corresponding bit of the latched external address in the first clock cycle in the sequential mode in response to the first control signal to store the calculating result in the calculation result flip-flop, and calculating a value for a next clock cycle from the latched calculating result in a current clock cycle in the sequential mode to store the calculating result in the calculation result flip-flop.

* * * * *